United States Patent [19]

Sim

[11] Patent Number: 5,152,881
[45] Date of Patent: Oct. 6, 1992

[54] PLATING SYSTEM

[75] Inventor: Ah T. Sim, Singapore, Singapore

[73] Assignee: Sun Industrial Coatings Private Limited, Singapore

[21] Appl. No.: 660,023

[22] Filed: Feb. 25, 1991

Related U.S. Application Data

[62] Division of Ser. No. 524,082, May 16, 1990, Pat. No. 5,087,333.

[30] Foreign Application Priority Data

May 19, 1989 [GB] United Kingdom ............... 8911566

[51] Int. Cl.⁵ ............................................. C25D 17/06
[52] U.S. Cl. ............................. 204/297 R; 204/297 W
[58] Field of Search ............................... 204/286-289, 204/297 R, 297 W, 279

[56] References Cited

U.S. PATENT DOCUMENTS

| | | | |
|---|---|---|---|
| 3,039,951 | 6/1962 | Clenard et al. | 204/297 W |
| 4,088,559 | 5/1978 | Sandmeier et al. | 204/297 W |
| 4,561,960 | 12/1985 | Jeannot et al. | 204/297 W |
| 4,643,128 | 2/1987 | Bracher et al. | 204/297 W X |
| 4,752,371 | 6/1988 | Kriesel et al. | 204/297 W |
| 4,855,032 | 8/1989 | Fabrian et al. | 204/286 |
| 4,899,966 | 2/1990 | Antos et al. | 204/297 W X |

OTHER PUBLICATIONS

"Spring-Type Tension Tip", *Metal Finishing*, vol. 86, No. 1A, p. 768 (1988).

*Primary Examiner*—Donald R. Valentine
*Attorney, Agent, or Firm*—Bacon & Thomas

[57] ABSTRACT

Apparatus for plating electrical or electronic components, comprises a plating chamber (2) for receiving electrolyte through which a current is to be passed via a first anode (10) and cathode (13) pair, means being provided to arrange a component (12) to be plated as the cathode of said first pair, means for supplying the plating chamber with electrolyte enriched with plating material, the supplying means including a reservoir chamber (4) for receiving electrolyte through which a current is to be passed via a second anode and cathode pair (21,22), means being provided to arrange a body of plating material (17) as the anode of said second pair, whereby in use plating material dissolved from the anode of the second pair enriches the electrolyte supplied to the plating chamber (2) and is deposited on the cathode of the first pair. The component (12) may be an integrated circuit strip package or the like, and may be carried during plating by a carrier (11) which comprises upper and lower supports for engaging respective longitudinal edges of the strip along the length thereof.

15 Claims, 6 Drawing Sheets

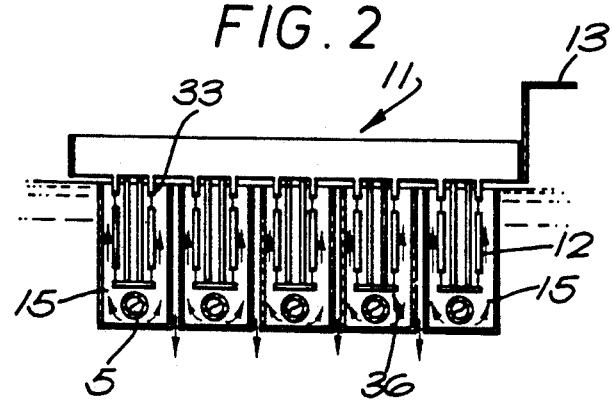
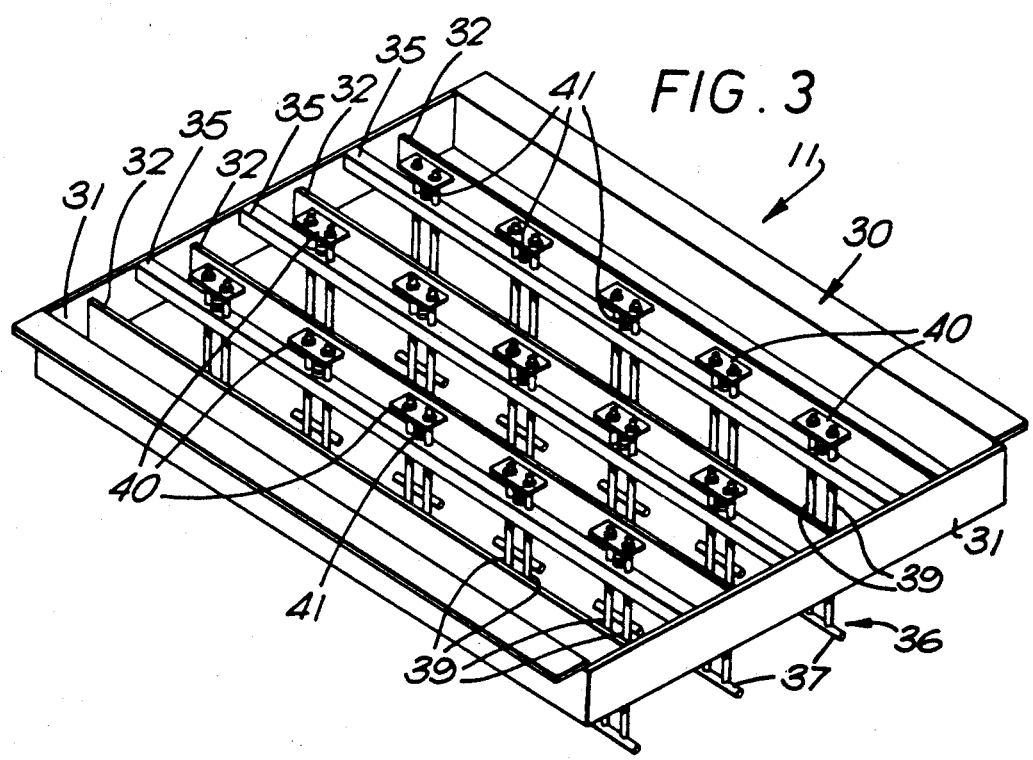

PLATING SYSTEM

This application is a division, of application Ser. No. 07/524,082, now U.S. Pat. No. 5,087,333, filed May 16, 1990.

This invention relates to a system for plating electrical or electronic components, such as the leads of integrated circuit packs.

There are now becoming increasingly popular "plastic leadless chip carriers", known as "PLCC's", and "small outline integrated circuits" known as "SOIC's". These are formed from "quad flat packs" which have a relatively flat body, rectangular in plan view, and with leads projecting from all four sides in the same plane as the flat body. The leads, normally of copper, are bent to the required shape so as to form either a PLCC or an SOIC. Current quad flat packs available may have 5,7,11,13 or 17 or more leads along each side, and are generally square or rectangular or similarly shaped in plan view. The spacing between adjacent leads may be as small as 0.025 inches (0.64 mm) and it is anticipated that it will be reduced even further. Such quad flat packs are typically provided in strip form with a continuous metal edge along each longitudinal edge of the strip.

It is known to apply solder to the leads of such components after the leads have been bent to the required shape by immersion in a bath of molten solder. However, with the small spacing between adjacent leads referred to above the capillary action of the molten solder can cause the spacing to be bridged, resulting in a short circuit. As a consequence there has been a move to the use of electroplating as an alternative system of coating the leads of integrated circuit packs.

Electroplating involves immersing a component in a bath of plating solution and forming an electric circuit with the leads of the component as the cathode and an anode made of the metal with which the leads are to be plated. As a current is passed through the system, the anode metal goes into solution and is gradually consumed whilst the cathode is plated by the metal provided by the anode.

It is particularly desirable when plating the leads of electrical or electronic components for each lead to be uniformly plated by a layer having a thickness falling within a particular range. Industry requirements are becoming increasingly stringent and the thickness range presently specified is 300 to 700 microinches (0.0076 to 0.018 mm). Above the lower limit, the plate thickness provides the lead with adequate protection, for example to pass the presently so-called 16 hour reliability steam test. An upper limit is specified because if the plate is too thick then when the leads are bent to the required shape, the plate flakes off and protection is lost.

A problem with the known plating system is that as the anode is consumed, the conditions in the system, particularly the spacing between the anode and the cathode and the surface area of the anode, do not remain constant. As a result, uniform coating of the leads forming the cathode within the specified range cannot be guaranteed. Attempts in the industry to overcome this problem by replenishing the anode, for example by adding balls of anode metal at regular intervals, have not been entirely successful since there are inevitably changes in conditions as the anode is consumed and periodically replenished.

Viewed from one aspect the invention provides apparatus for plating electrical or electronic components, comprising a plating chamber for receiving electrolyte through which a current is to be passed via a first anode and cathode pair, means being provided to arrange a component to be plated as the cathode of said first pair, means for supplying the plating chamber with electrolyte enriched with plating material, the supplying means including a reservoir chamber for receiving electrolyte through which a current is to be passed via a second anode and cathode pair, means being provided to arrange a body of plating material as the anode of said second pair, whereby in use plating material dissolved from the anode of the second pair enriches the electrolyte supplied to the plating chamber and is deposited on the cathode of the first pair.

The invention also provides a method of plating electrical or electronic components, comprising passing an electric current through electrolyte in a plating chamber via a first anode and cathode pair, the cathode of said first pair being provided by a component to be plated, and supplying the plating chamber with electrolyte enriched with plating material, the electrolyte being enriched by passing electric current therethrough in a reservoir chamber via a second anode and cathode pair, the anode of said second pair being provided by a body of plating material, wherein plating material dissolved from the anode of the second pair enriches the electrolyte supplied to the plating chamber and is deposited on the cathode of the first pair.

With such an arrangement, the anode in contact with the electrolyte in the plating chamber is not consumed during the plating process since it does not itself dissolve to provide the plating material as in previous systems. Instead, all the plating material deposited on the component to be plated is provided by the enriched electrolyte supplied to the plating chamber from the separate reservoir chamber. Thus the size and shape of the anode in the plating chamber, which will preferably be formed of a material such as stainless steel or titanium which is inert under the prevailing conditions, remains constant so that the electrical or electronic component can be uniformly plated with a layer of material of the desired thickness. The ability of the system to maintain a constant and consistent concentration of plating material in the electrolyte supplied to the plating chamber, thereby ensuring uniform plating of components, may to a certain extent depend on the ability to control the conditions in the reservoir chamber, such as the level of electric current and the size of the material anode. In a preferred system, for example, it has been found possible to coat the leads of a quad flat pack with solder having a thickness in the range 350 to 650 micro-inches (0.0089 to 0.0165 mm).

The electrolyte will normally be a plating solution and is preferably a high speed plating solution compatible with the plating material which can be a variety of materials, such as solder, gold, tin, chrome, titanium, etc. Various high speed plating solutions are available and one suitable solution is MSA (methyl sulphonic acid) supplied by M/S Penwalt Corporation, of Philadelphia, U.S.A.

The plating chamber will normally be provided with means for removing electrolyte which has been depleted of the plating material, and such electrolyte is preferably returned to the reservoir chamber for enrichment with plating material. Thus, there is provided a closed circuit for the electrolyte to which plating material is added by the dissolving anode in the reservoir chamber. The electrolyte will normally however require to be periodically replaced.

Although various arrangements are possible, the electrolyte level in the reservoir chamber is preferably lower than that in the plating chamber. Thus, the electrolyte may be passed from an outlet of the reservoir chamber to an inlet of the plating chamber by means of a pump and may return to the reservoir chamber under gravity.

The means for providing an anode formed of plating material preferably comprises an electric contact disposed in the reservoir chamber and arranged to be contacted by the plating material which might be supplied in the form of balls e.g. of solder. Thus the electric contact may be located in a receptacle for receiving such balls.

In a preferred system, there are two such electric contacts disposed in the reservoir chamber for contact with respective bodies of plating material, and the direction of electric current in the reservoir is reversible such that one body of plating material forms the anode when current is passed in one direction and the other body of plating material forms the anode when the current is reversed to pass in the other direction. Consequently, both bodies of plating material will be alternately dissolved so that any plating material deposited on the body acting as a cathode will subsequently be removed when the current is reversed. As a result, wastage of the plating material is avoided. The current may be periodically reversed at intervals of a few minutes or an hour or more.

The two bodies of plating material might be provided in respective receptacles separated by a solid barrier made of a suitable insulating material such as polypropylene. The dissolved plating material in the form of ions would then be required to move round this barrier and the outlet for drawing off electrolyte enriched with the dissolved plating material would be arranged in the path of movement at a suitable location, for example, beneath a vertically arranged barrier. Alternatively, the two receptacles could be spaced apart with the outlet arranged in the space between the receptacles. Each receptacle might for example have a perforated side wall through which the dissolved plating material can pass.

It is desirable when supplying the electrolyte containing dissolved plating material to the plating chamber to avoid stagnation of the electrolyte in the region of the component to be plated. It is advantageous therefore to arrange the inlet and outlet of the plating chamber such that in use the electrolyte flows from the inlet past the component to the outlet. This can be achieved by locating the inlet below the component and causing the electrolyte to flow upwardly past the component to an upper location where it overflows and returns under gravity to the reservoir. Preferably a filter is provided in the return path from the plating chamber to the reservoir. The plating chamber inlet might be in the form of a pipe having a plurality of openings at intervals along its length, so as to introduce the electrolyte to the plating chamber along the length thereof. This is particularly advantageous where the components to be coated are of elongate form and are arranged parallel to the inlet pipe, the components being for example in the form of an integrated circuit strip package. The spaced openings of the inlet pipe will advantageously ensure that the enriched electrolyte flows evenly past all the components to be plated, so contributing to the objective of reliable and uniform plating of every component. In a preferred embodiment, the inlet pipe is arranged to be located below the component and the outlet is arranged to be located above the component, whereby in use the electrolyte is caused to flow upwardly past the component.

To maximise the use of space, the plating chamber might be provided with a plurality of laterally spaced inlet pipes, the chamber being divided into a corresponding plurality of longitudinal passages each fed by a respective inlet pipe. In each case, the inlet pipe will preferably be located in a lower region of the passage with the component to be plated supported above the inlet pipe and immersed in the electrolyte which flows upwardly to overflow past an upper rim of the passage. In use, the walls of the longitudinal passages will become the anode of the system, and the components will be arranged longitudinally so that all portions to be plated are at the same spacing from the anode.

It will thus be necessary to provide a suitable carrier for the electrical or electronic components when they are in the plating chamber. A carrier has been developed which is particularly useful for holding electrical or electronic components in strip form during plating by the system described above.

Thus viewed from another aspect the invention provides a carrier for a strip of electrical or electronic components, such as an integrated circuit strip package or the like, comprising first and second supports for engaging respective longitudinal edges of a strip along the length thereof, the supports being resiliently urged towards each other for securing the strip, and at least one of the supports having an electrically conductive portion for making electrical contact with the respective longitudinal edge of the strip.

With such an arrangement, the strip can be securely located between the supports by being engaged along both longitudinal edges. Once located in the carrier, the strip may be immersed in an electrolyte and connected up such that the strip becomes the cathode of an electroplating system to plate portions e.g. leads of the strip.

One or both of the supports may be arranged to make continuous longitudinal contact with the respective edge of the strip, for example by means of a longitudinal groove for receiving the strip. Preferably however each support is arranged to engage a respective strip edge at discrete locations longitudinally spaced from each other, for example by means of a plurality of longitudinally spaced recesses or notches for receiving the respective strip edge. The longitudinal spaces allow access of the electrolyte to both sides of the strip along its length. Furthermore, the force applied by the resilient urging means is applied over a relatively small area so that if one or more of the recesses or notches is used to make the electrical contact with the strip, the increased contact pressure will ensure a reliable electrical connection. The discrete engagement locations of the first support may be longitudinally offset from those of the second support. As a result, the supports will not interfere with each other whilst the strip is carried in a stable manner.

The first and second supports might be resiliently urged together by any suitable means. The carrier preferably comprises a main frame to which the first support is fixed, and a plurality of longitudinally spaced springs, for example compression springs, arranged to urge the second support towards the first support. The second support may be a single longitudinal member, but is preferably in the form of a plurality of discrete support portions each urged by a respective spring towards the first support. Such an arrangement can cope with any variation in the width of a strip over its length, since each support portion is independently urged towards the first support. The first support is also preferably in the form of a plurality of discrete support portions, each such portion projecting from the carrier main frame.

Each support portion of the second support preferably has an abutment for engaging the end of a respective spring. It may also have a spindle which passes axially through the spring, but preferably a pair of laterally spaced legs are provided one on each side of the spring, thereby to give the support portions lateral stability. It might be possible to arrange for a strip to be received between such lateral legs, but for ease of insertion, the strip is preferably received to one side of the legs. It is particularly desirable for a pair of strips to be supported, one on each side of the spindle or legs.

In practice, it will be desirable for the strip or strips to be held by the carrier such that they can be fully immersed in an electrolyte during plating, whilst keeping to a minimum the amount of the carrier itself which is immersed. This will reduce the chance of introducing unwanted impurities to the electrolyte. Thus the first support described above as being fixed to the carrier main frame will preferably be an upper support, whilst the second, relatively movable support will be a lower support. In a preferred embodiment for supporting a pair of strips, the upper support comprises a plurality of longitudinally spaced pairs of upper support portions, each pair comprising two laterally spaced downward projections each for receiving the upper edge of a respective strip, and the lower support comprises a plurality of longitudinally spaced lower support portions each being substantially in the form of an inverted "T", each arm of the "T" extending laterally and being arranged to receive the lower edge of a respective strip, and the upright leg of the "T" having an abutment urged upwardly by a spring, whereby a pair of strips can be secured at a lateral spacing from each other between the upper and lower supports. In use, it is necessary only for the lower ends of the upper support portions and the lower part of the "T" shaped lower support portions to be immersed in the electrolyte, so that the springs and the main body of the carrier can remain dry. This reduces any chance of contaminating the electrolyte.

Preferably the carrier consists of a plurality of such upper and lower supports arranged laterally one next to the other. Such a carrier may be used with the plating system described above having a plurality of longitudinal passages, whereby each longitudinal passage receives a pair of strips supported by respective upper and lower supports. The strips will preferably be supported in a substantially vertical plane in intimate contact with the upward flow of electrolyte containing dissolved plating material, the strips being at the same spacing from the walls of the longitudinal passages along their entire length.

In one example, the carrier supports five pairs of strips and the plating chamber is correspondingly divided into five longitudinal passages, so that a total of ten strips are plated at once. Using a strip including six integrated circuits, the system will handle sixty integrated circuits in each plating operation.

The carrier may be constructed from titanium or stainless steel or any other suitable material capable of withstanding the environment of the processing steps to which the strip or strips are to be subjected. The portions of the carrier which are to be immersed in electrolyte will preferably be coated with P.T.F.E. or other suitable insulating material, with the parts for making electrical contact with the strip(s), such as the notches or recesses provided on the support, being left uncoated.

Before and after plating the electrical or electronic components certain other processing steps are normally performed. In known systems the components are subjected to processing steps of degreasing, rinsing, pickling, rinsing, plating, rinsing, and drying. It has now been discovered that the steps of degreasing, pickling and rinsing are not necessary prior to plating the components, and that these steps can be replaced by an electrical step in which the portion of the component to be coated is made the anode in a bath of electrolyte and is thus cleaned in readiness for plating.

Thus viewed from a further aspect the invention provides a method of plating electrical or electronic components, comprising immersing a component to be plated in a first bath of plating solution and passing an electric current through the bath with the component as the anode, rinsing the component in a second bath of plating solution, and immersing the component in a third bath of plating solution and passing an electric current through the bath with the component as the cathode, so as to plate the component.

This method reduces the number of steps involved and thus the time taken to plate a given number of components. Apparatus for carrying out the method can also be of reduced size.

The step of (pre-plating) rinsing using plating solution rather than water is particularly advantageous since there is less risk of contamination. Water, for example, can contain an undersirably high level of impurities such as dissolved chlorine. The plating step will normally be followed by a further post-plating rinsing step but since plating is complete water is normally used. Finally the component will generally be subjected to a drying step.

The invention also provides apparatus for carrying out the method described above, the apparatus having three chambers for receiving the first, second and third baths of plating solution respectively. It is particularly advantageous to use the previously described plating system in which the plating chamber is supplied with electrolyte enriched with dissolved plating material. When the component to be plated is in strip form, the carrier described above may be used to support the strip or strips during all the processing steps.

Certain preferred embodiments of the invention will now be described by way of example and with reference to the accompanying drawings, in which:

FIG. 2 is a transverse sectional view through the plating chamber shown in FIG. 1;

FIG. 3 is a perspective view of a pallet for securing strips of components;

Figure 1:
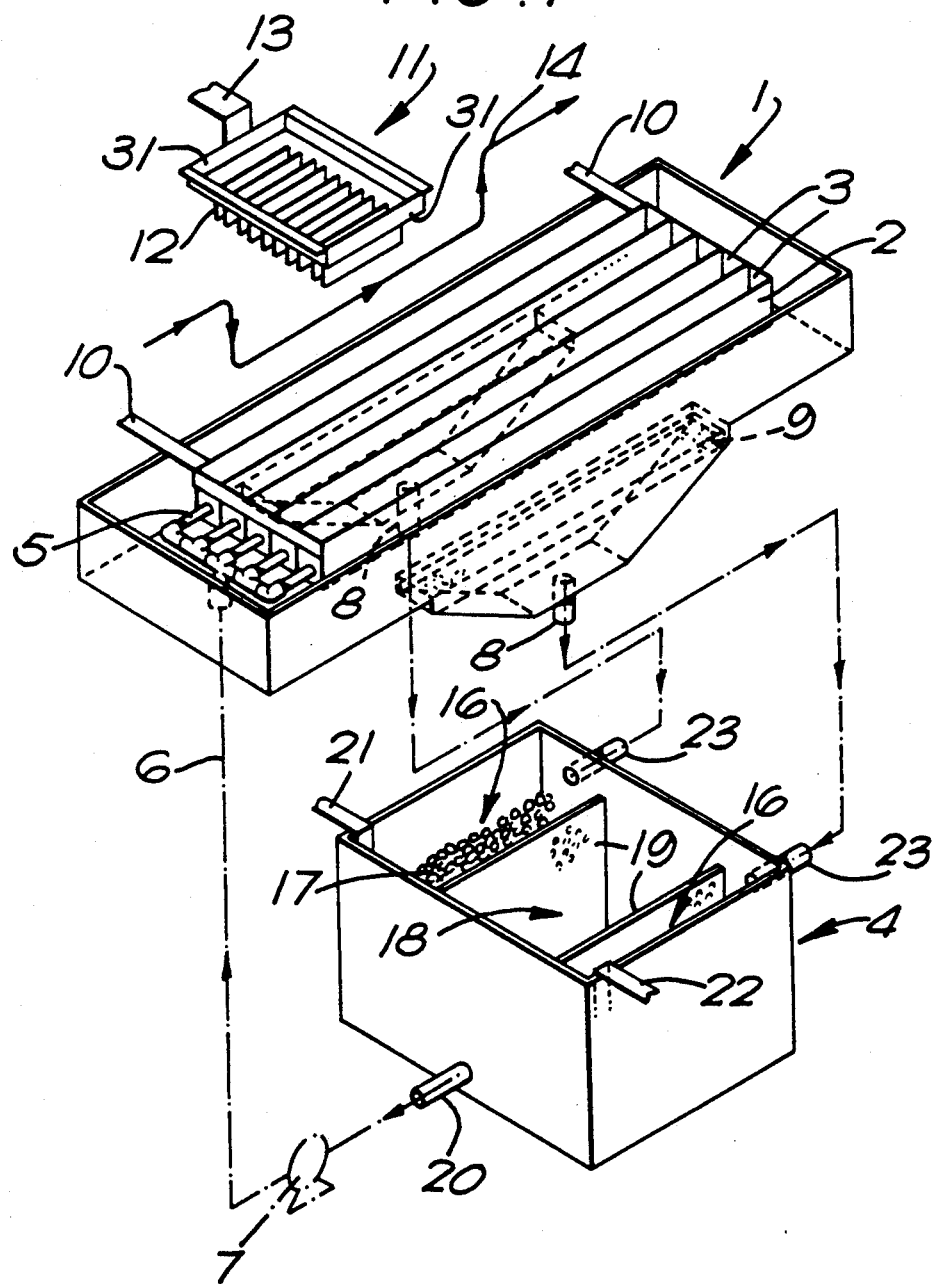
FIG. 1 is a schematic perspective view of a plating system in accordance with the invention.
Figure 4:
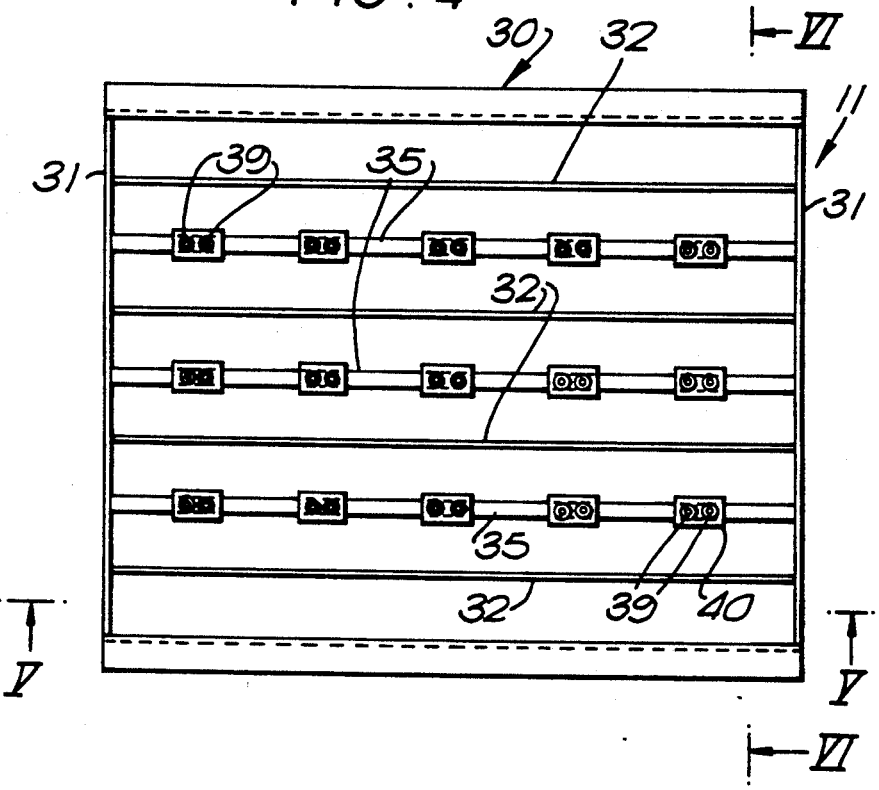
FIG. 4 is a plan view of the pallet shown in FIG. 3.

Referring firstly to FIGS. 1 and 2, the plating system 10 includes a plating tank 1 having a plating chamber 2 divided into five longitudinal passages 3 which are supplied with electrolyte in the form of plating solution containing dissolved plating material from a reservoir tank 4. Each passage 3 has in its lower region an inlet pipe 5 formed with a plurality of inlet holes (not shown) disposed at intervals along the length of the pipe. The inlet pipes 5 are fed from a common supply pipe 6 through which plating solution is pumped from the reservoir tank 4 by means of a pump 7. In the base of the plating tank 3 a pair of outlet ports 8 are provided to return the plating solution from the plating tank to the reservoir tank 4. Above each outlet port 8 a filter 9 of polypropylene wool or the like is arranged to remove contaminants from the plating solution. The walls of the passages 3 making up the plating chamber 2 are formed of a metal such as titanium or stainless steel which is inert under the electroplating conditions. These walls are connected up to become the anode 10 of the electroplating system.

A pallet 11 on which are mounted ten strips 12 of components is connected up to become the cathode 13 of the system. In use, the pallet 11 is conveyed along the path 14 shown in FIG. 1. As seen in FIG. 2, this allows the strips 12 to be fully immersed in a bath 15 of plating solution contained in each longitudinal passage 3 of the plating chamber 2, a pair of strips being received.

The reservoir tank 4 is provided separately from the plating tank and is formed of an insulating material such as polypropylene and comprises a pair of electrode chambers 16 in which balls 17 of solder or other plating material may be received. The two chambers 16 are spaced apart by a central chamber 18, each electrode chamber being separated from the central chamber by a perforated wall 19. An outlet 20 is arranged in the central chamber 18 so that plating solution containing dissolved plating material may be drawn off from this central chamber by operation of the pump 7. Each electrode chamber 16 has located therein an electrode 21, 22 arranged to be in intimate contact with the balls of plating material disposed in the chamber. Each electrode 21, 22 can be connected up to become either the anode or the cathode of the electrolysis system in the reservoir tank. Thus, for example, when electrode 21 becomes the anode then the balls of plating material disposed in the associated chamber 16 go into solution and move towards the cathode 22. As the dissolved plating material in the form of positive ions passes through the central chamber 18 it is drawn off via the outlet 20 and pumped via the common feed pipe 6 to the plating chamber 2. The plating solution is distributed via the pipes 5 to the longitudinal passages 3 and flows upwardly past the pair of strips in each passage to overflow past the top of the passage walls and return under gravity via the outlets 8 of the plating tank 1 to a pair of inlets 23 of the reservoir tank 4.

Figure 5:
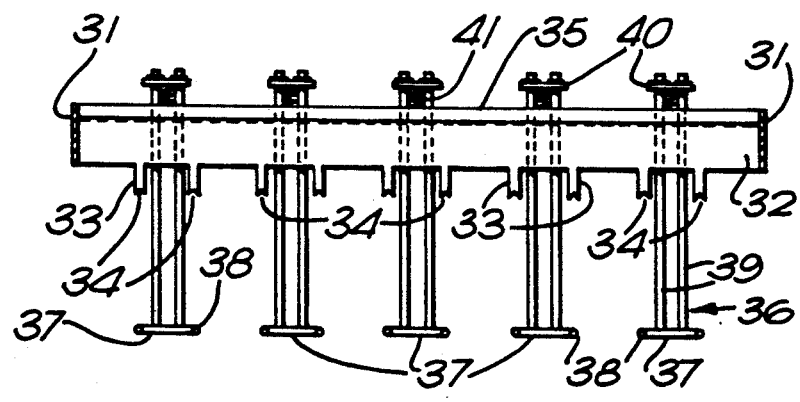
FIG. 5 is a section on the lines V—V of FIG. 4.
Figure 6:
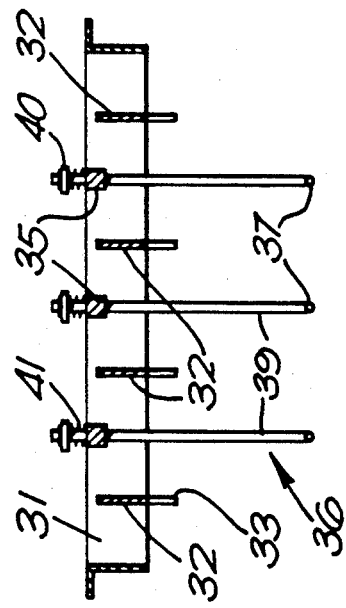
FIG. 6 is a section on the lines VI—VI of FIG. 4.

Referring now to FIGS. 3 to 6, the pallet 11 has a main frame 30 which includes at opposite sides of the pallet a pair of longitudinally extending side members 31. A plurality of upper locating bars 32 extend laterally between the two side members 31 at spacings along the length of the pallet. Each upper locating bar 32 has a plurality of downward projections 33 spaced at intervals across the pallet. As seen in FIG. 5 there are ten downward projections 33 (whereas the pallet shown in FIGS. 8 and 9 include four such downward projections 33). Each projection is formed at its lower end with a notch 34 for receiving the upper edge of a respective strip of electrical or electronic components.

A plurality of lower locating bars 35 extend laterally between the longitudinal side members 31 and are arranged at spacings along the length of the pallet in positions longitudinally offset from the upper locating bars 32. On each lower locating bar 35 a plurality of lower strip supports 36 are mounted, there being two such supports 36 in the embodiment of FIGS. 8 and 9 and five such lower strip supports in the embodiment of FIGS. 3 to 6. Each lower support 36 is substantially in the form of an inverted "T", wherein each arm 37 of the "T" is formed with a notch 38 for supporting the lower longitudinal edge of a respective strip 12. The upright portion of the "T" shaped lower strip support comprises a pair of spaced legs 39 which extend through guide holes provided in the lower locating bar 35. At their upper ends the two legs 39 are connected by an abutment 40 engaged by a compression spring 41 which locates at its lower end against the lower locating bar 35. Thus the "T" shaped lower support 36 is urged upwardly by the spring so that the pair of strips 12 are secured in position between the lower and upper notches 38 and 34.

Figure 7:
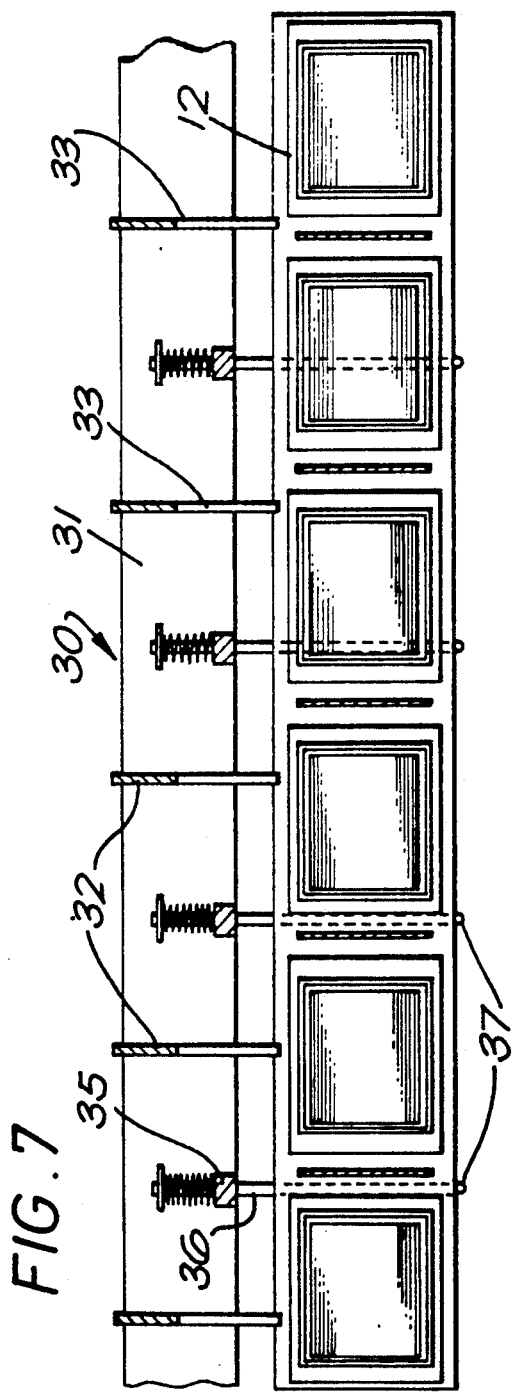
FIG. 7 is a view similar to that of FIG. 6 but showing another pallet on which strips of components are secured.
Figure 8:
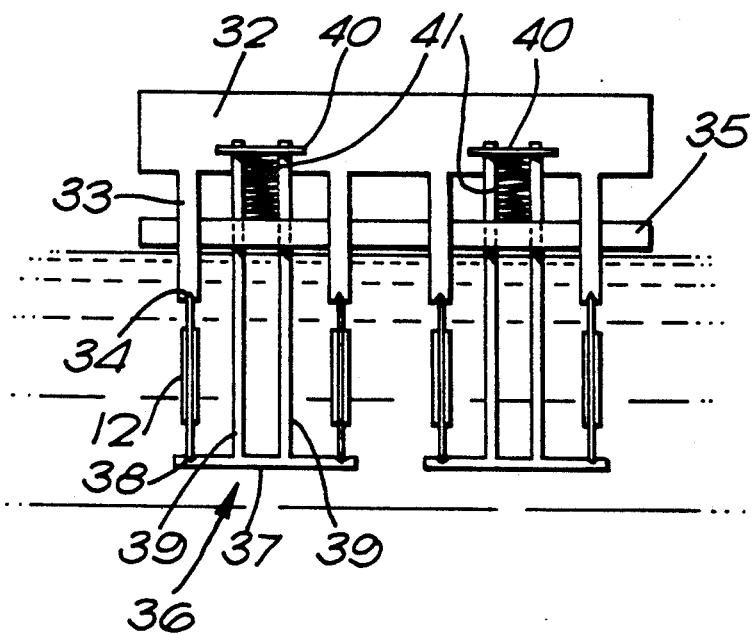
FIG. 8 is an end elevation view of the pallet of FIG. 7.
Figure 9:
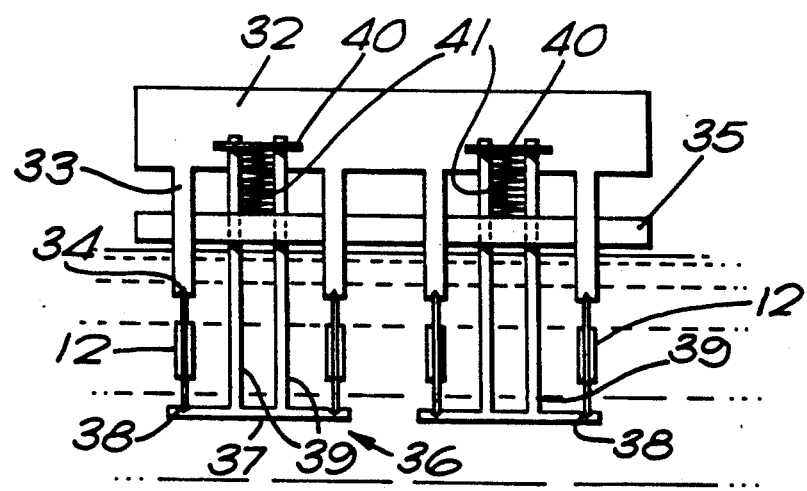
FIG. 9 is an end elevation view of an alternative form of pallet for securing strips of reduced width.

The pallet arrangements shown in FIGS. 7,8 and 9 have parts corresponding to the pallet already described and the corresponding parts are therefore denoted by the same reference numerals. The pallet of FIG. 9 is designed for use with strips of reduced width.

As seen in FIGS. 8 and 9, the pallet will generally be immersed in the plating solution to a depth such that the strips are fully submerged whilst a substantial part of the pallet remains above the level of the solution. At least the immersed parts of the pallet are coated with an insulating material such as polytetrafluoroethylene (P.T.F.E.), with the notches 34,38 left uncoated so as to provide electrical contacts. Each pair of strips 12 is supported separately from the adjacent pair so as to be insertable in a separate longitudinal passage 3 of the plating chamber 2.

In use of the plating system, the pallet 11 is connected up to become the cathode whilst the plating chamber 2 becomes the anode. Each strip 12 has continuous longitudinal metal edges which make an electrical connection with the upper and lower supports of the pallet at the notches 34, 38. Thus the plating material dissolved in each bath 15 of plating solution is deposited on the immersed metal portions, including the leads, of the strips. The dissolved plating material is not supplied by the anode in the plating chamber as in previous systems, but instead is supplied from a separate electrochemical system in the reservoir tank 4, as described previously. As a result the relationship between the anode in the plating chamber and each strip remains constant during plating and this will produce a plating layer of uniform thickness. The ability of the system to maintain constant plating conditions means that the layer of plated material can be produced in a relatively narrow range of thicknesses so that substantially all the strips meet the required standards. Thus virtually no strips need to be discarded and wastage is avoided.

Figure 10:
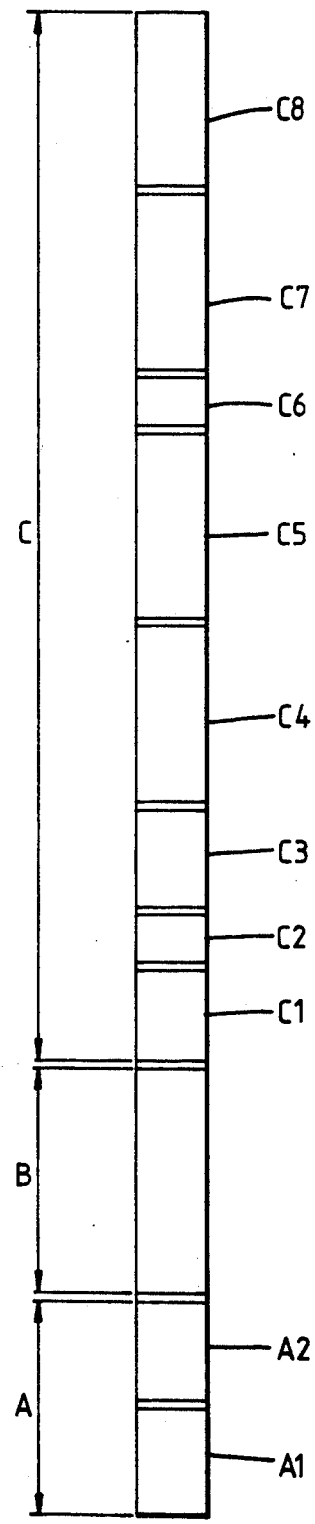
FIG. 10 shows the processing steps in a plating line in accordance with the invention.

As shown in FIG. 10, prior to plating the strips will normally undergo pre-cleaning sequence "A", which involves electro-cleaning step A1 and pre-plating rinsing step A2. Electro-cleaning step A1 is effected by connecting the carrier, and hence the strips, as an anode in a first bath of plating solution, whilst rinsing is effected by dipping the strips in a second bath of plating solution. After plating sequence "B" the strips are subjected to the post-cleaning sequence "C" which involves the following steps shown in FIG. 10: water rinse C1 (post-plating rinsing), air blow C2, acid dip C3, water rinse C4, final water rinse C5, air blow C6, hot air dry C7 and cooling C8.

Known plating solutions and plating materials can be used in the system. It is particularly desirable to use a high speed plating solution which can give a plating time of approximately two to three minutes. The voltage applied to both the plating chamber system and the reservoir tank system may be of the order of a few volts, whilst the currents passed in each system might typically be in the range of 20 to 200 amps. By way of example, using the MSA plating solution mentioned earlier, typical parameter settings are as follows:

| Reservoir tank | 10-12 volts |
| --- | --- |
|  | 20-30 amps |
| Plating chamber | 4-5 volts |
|  | 35-40 amps |
| Immersion time | 2 minutes |

It will be appreciated that the present specification discloses various inventive features and also that variations and modifications may be made whilst still retaining at least some of the advantages referred to.

I claim:

1. A carrier for strip of electrical or electronic components to be immersed in an electroplating bath, the strip having opposite longitudinal edges, the carrier comprising first and second supports each having a plurality of discrete longitudinally spaced electrically conductive portions for engaging and making electrical contact with a respective longitudinal edge of the strip along the length thereof, the conductive portions of the first support being longitudinally offset from those of the second support, and the supports being resiliently urged towards each other so as to urge the opposite longitudinal edges of the strip towards each other and to secure the strip between the supports.

2. A carrier as claimed in claim 1, further comprising a main frame to which the first support is fixed, and a plurality of longitudinally spaced springs arranged to urge the second support towards the first support.

3. A carrier as claimed in claim 2, wherein the first support is an upper support comprising a plurality of longitudinally spaced pairs of upper support portions, each pair comprising two laterally spaced downward projections each for receiving the upper edge of a respective strip, and the second support is a lower support comprising a plurality of longitudinally spaced lower support portions each being substantially in the form of an inverted "T", each arm of the "T" extending laterally and being arranged to receive the lower edge of a respective strip, and the upright leg of the "T" having an abutment urged upwardly by a said spring, whereby a pair of strips can be secured at a lateral spacing from each other between the upper and lower supports.

4. A carrier as claimed in claim 2, further comprising a plurality of such upper and lower supports arranged laterally one next to the other.

5. A carrier as claimed in claim 1, wherein the first and second supports include portions to be immersed in the electroplating bath which are coated with insulating material, apart from the electrically conductive portions for making electrical contact with the longitudinal edges of the strip, which are left uncoated.

6. A carrier as claimed in claim 1, further comprising a main frame to which the first support is fixed, and a plurality of longitudinally spaced springs arranged to urge the second support towards the first support.

7. A carrier as claimed in claim 6, wherein the second support is in the form of a plurality of discrete support portions each urged by a respective spring towards the first support.

8. A carrier as claimed in claim 6, wherein the first support is in the form of a plurality of discrete support portions, each such portion projecting from the carrier main frame.

9. A carrier for a strip of electrical or electronic components to be immersed in an electroplating bath, the strip having first and second longitudinal edges opposite each other, the carrier comprising a first support having a plurality of electrically conductive portions longitudinally spaced from each other for engaging and making electrical contact with the first longitudinal edge of the strip at longitudinally spaced locations, a second support having a plurality of electrically conductive portions longitudinally spaced from each other for engaging and making electrical contact with the second longitudinal edge of the strip at longitudinally spaced locations, the supports being resiliently urged towards each other so that the electrically conductive portions of the first support are urged towards the first longitudinal edge of the strip and the electrically conductive portions of the second support are urged towards the second longitudinal edge of the strip, whereby the opposite longitudinal edges of the strip are urged towards each other so as to secure the strip between the supports, and whereby the first and second supports make electrical contact with the strip along both longitudinal edges thereof at said respective longitudinally spaced locations.

10. A carrier as claimed in claim 9, further comprising a main frame to which the first support is fixed, and a plurality of longitudinally spaced springs arranged to urge the second support towards the first support.

11. A carrier as claimed in claim 10 wherein the first support is an upper support comprising a plurality of longitudinally spaced pairs of support portions, each pair comprising two laterally spaced downward projections each for receiving the upper edges of a respective strip, and the second support is a lower support comprising a plurality of longitudinally spaced lower support portions each being substantially in the form of an inverter "T", each arm of the "T" extending laterally andb eing arranged to receive the lower edge of a respective strip, and the upright leg of the "T" having an abutment urged upwardly by said spring, whereby a pair of strips can be secured at a lateral spacing from each other between the upper and lower supports.

12. A carrier as claimed in claim 10 wherein the second support is in the form of a plurality of discrete support portions each urged by a respective spring towards the first support.

13. A carrier as claimed in claim 10 wherein the first support is in the form of a plurality of discrete support portions each projecting from the carrier main frame.

14. A carrier as claimed in claim 9, further comprising a plurality of such first and second supports arranged laterally one next to the other.

15. A carrier as claimed in claim 9, wherein the first and second supports include portions to be immersed in the electroplating bath which are coated with insulating material, apart from the electrically conductive portions for making electrical contact with the longitudinal edges of the strip, which are left uncoated.

* * * * *